United States Patent
Shi et al.

(10) Patent No.: US 12,369,249 B2
(45) Date of Patent: Jul. 22, 2025

(54) PRINTED CIRCUIT BOARD ASSEMBLY AND ELECTRONIC DEVICE

(71) Applicant: HUAWEI TECHNOLOGIES CO., LTD., Shenzhen (CN)

(72) Inventors: Hongbin Shi, Xi'an (CN); Xin Guo, Xi'an (CN); Lixiang Wang, Shanghai (CN); Haisheng Tu, Shanghai (CN); Benyin Zheng, Shanghai (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 190 days.

(21) Appl. No.: 18/246,036

(22) PCT Filed: Sep. 7, 2021

(86) PCT No.: PCT/CN2021/116854
§ 371 (c)(1),
(2) Date: Mar. 21, 2023

(87) PCT Pub. No.: WO2022/068535
PCT Pub. Date: Apr. 7, 2022

(65) Prior Publication Data
US 2023/0363087 A1 Nov. 9, 2023

(30) Foreign Application Priority Data
Sep. 30, 2020 (CN) .......................... 202022224031.9

(51) Int. Cl.
*H05K 1/02* (2006.01)

(52) U.S. Cl.
CPC ......... *H05K 1/0298* (2013.01); *H05K 1/0271* (2013.01); *H05K 2201/09027* (2013.01);
(Continued)

(58) Field of Classification Search
CPC ........ H05K 1/0298; H05K 1/144; H05K 5/03; H05K 1/181; H05K 3/24; H05K 1/147;
(Continued)

(56) References Cited

U.S. PATENT DOCUMENTS 5,263,868 A * 11/1993 Renn ...................... H01R 12/52
439/493
6,531,662 B1  3/2003 Nakamura
(Continued)

FOREIGN PATENT DOCUMENTS

| CN | 206423039 U | 8/2017 |
| CN | 106061224 B | 3/2019 |

(Continued)

OTHER PUBLICATIONS

English Translation JP2002216873, PFU Ltd, Hiromitsu Morikawa, Published Aug. 2, 2002 (Year: 2002).*

*Primary Examiner* — Steven T Sawyer

(57) ABSTRACT

This application provides a printed circuit board assembly and an electronic device. The printed circuit board assembly includes: a printed circuit board, where the printed circuit board includes a functional network, and the functional network is configured to provide an electrical function; a conductive part, where the conductive part is connected to the printed circuit board and is electrically connected in parallel to the functional network; and a cover-shaped structure, where the cover-shaped structure covers the conductive part and is connected to the printed circuit board, and the cover-shaped structure is configured to prevent the conductive part located in the cover-shaped structure from contacting a conductor outside the cover-shaped structure. The foregoing technical solutions can reduce impedance of a circuit board, improve a current utilization, and further improve mechanical reliability of the circuit board.

16 Claims, 9 Drawing Sheets

(52) U.S. Cl.
CPC .............. *H05K 2201/09081* (2013.01); *H05K 2201/2009* (2013.01)

(58) Field of Classification Search
CPC .......... H05K 2201/09027; H05K 2201/09081; H05K 2201/2009; H05K 1/0271; H05K 2201/053; H05K 2201/0909; H05K 2201/0989; H05K 1/142; H04M 1/0277
See application file for complete search history.

(56) References Cited

U.S. PATENT DOCUMENTS

| | | | |
|---|---|---|---|
| 2009/0217522 A1* | 9/2009 | Ito .................... | H01L 23/5385 29/852 |
| 2010/0051334 A1 | 3/2010 | Ho et al. | |
| 2015/0028968 A1* | 1/2015 | Katipally ............. | H01Q 3/32 333/136 |
| 2020/0254721 A1* | 8/2020 | Lee .................... | B32B 19/04 |
| 2021/0076490 A1* | 3/2021 | Hashiguchi .......... | H05K 1/0283 |

FOREIGN PATENT DOCUMENTS

| | | |
|---|---|---|
| CN | 213662046 U | 7/2021 |
| DE | 4425803 A1 | 2/1995 |
| JP | H02181305 A | 7/1990 |
| JP | 2002216873 A | 8/2002 |
| WO | 2019172719 A1 | 9/2019 |

\* cited by examiner

PRINTED CIRCUIT BOARD ASSEMBLY AND ELECTRONIC DEVICE

CROSS-REFERENCE TO RELATED APPLICATIONS

This application is a National Stage of International Patent Application No. PCT/CN2021/116854 filed on Sep. 7, 2021, which claims priority to Chinese Patent Application No. 202022224031.9, filed on Sep. 30, 2020. Both of the aforementioned applications are hereby incorporated by reference in their entireties.

TECHNICAL FIELD

Embodiments of this application relate to the field of electronic device technologies, and more specifically, to a printed circuit board assembly and an electronic device.

BACKGROUND

A printed circuit board (printed circuit board, PCB) is one of the important components in the electronic industry. The printed circuit board is used in most electronic devices as a support for electronic components and a carrier for electrical connections of the electronic components.

Generally, a shape of the printed circuit board may be adaptively designed based on an internal space of an electronic device and an arrangement manner of electronic components. Therefore, the printed circuit board usually includes parts with different widths. However, at a position where a width of the printed circuit board is narrow, there is usually an impedance bottleneck and a risk of board breakage, which affects electrical performance and mechanical reliability of the printed circuit board.

SUMMARY

This application provides a printed circuit board assembly and an electronic device, to reduce impedance of a circuit board, improve a current utilization, and further improve mechanical reliability of the circuit board.

According to a first aspect, a printed circuit board assembly is provided, including: a printed circuit board, where the printed circuit board includes a functional network, and the functional network is configured to provide an electrical function; a conductive part, where the conductive part is connected to the printed circuit board and is electrically connected in parallel to the functional network; and a cover-shaped structure, where the cover-shaped structure covers the conductive part and is connected to the printed circuit board, and the cover-shaped structure is configured to prevent the conductive part located in the cover-shaped structure from contacting a conductor outside the cover-shaped structure.

It should be understood that the printed circuit board may include a functional network and a non-functional network. The functional network may provide an electrical function, such as a charging, radio frequency, antenna, multimedia, data storage, or sensor function. The non-functional network cannot provide an electrical function, and is mainly used to implement a purpose such as mechanical connection. The non-functional network is usually grounded (ground, GND) or floats (not connected to any functional network or GND network), and is configured to isolate a structural part carried on the printed circuit board from the functional network, to avoid electric shocks or device damage caused by mistaken contact. In this embodiment of this application, the conductive sheet is electrically connected to the functional network, and the conductive sheet may transmit a current in the functional network. The printed circuit board assembly provided in this embodiment of this application includes the conductive part electrically connected in parallel to the functional network, and the conductive part may transmit a current. In this way, the conductive part provides a path for the current in the functional network, and impedance of the circuit board can be reduced. Correspondingly, impedance of the circuit board is reduced, heat generated is accordingly reduced, and a current utilization can be improved. Further, heat generated by the circuit board is reduced, and a temperature of the circuit board decreases. In this way, a temperature of another component that conducts heat of the circuit board, for example, a housing of the electronic device, is reduced, and heat dissipation of the electronic device can be further improved, thereby improving user experience.

The printed circuit board assembly provided in this embodiment of this application includes the cover-shaped structure. The cover-shaped structure may isolate the conductive part from a surrounding metal structural part, to prevent a short circuit caused by contact between the conductive part and the surrounding metal part.

In addition, designs of the conductive part and the cover-shaped structure can enhance mechanical reliability of the circuit board and reduce a risk of board breakage.

With reference to the first aspect, in a possible implementation, the cover-shaped structure is made of a metal material, and a gap is disposed between the cover-shaped structure and the conductive part.

The cover-shaped structure is designed to prevent a short circuit. When the cover-shaped structure is made of a metal material, a gap between the cover-shaped structure and the conductive part can avoid a short circuit of the conductive part.

Optionally, an insulation filler may be disposed in a gap between the conductive part and the cover-shaped structure.

With reference to the first aspect, in a possible implementation, the printed circuit board further includes a ground network, and the cover-shaped structure is electrically connected to the ground network. Alternatively, the cover-shaped structure is not electrically connected to the functional network, and is not electrically connected to the ground network.

The cover-shaped structure is grounded or floats, which may prevent a short circuit caused by contact between the conductive part and the surrounding metal part.

With reference to the first aspect, in a possible implementation, the printed circuit board further includes a non-functional network, the non-functional network is grounded or floats, and the cover-shaped structure is connected to the non-functional network.

Herein, connection between the cover-shaped structure and the non-functional network includes the following cases: If the non-functional network is grounded, the cover-shaped structure is grounded. If the non-functional network floats, the cover-shaped structure floats. That is, the cover-shaped structure is not electrically connected to the functional network and the ground network.

It should be understood that the non-functional network included in the printed circuit board is usually grounded or floats, and is configured to isolate the structural part carried on the printed circuit board from the functional network, to avoid electric shocks or device damage caused by mistaken contact.

With reference to the first aspect, in a possible implementation, the cover-shaped structure is made of an insulation material.

Optionally, the gap between the cover-shaped structure and the conductive part is greater than or equal to 0.

When the cover-shaped structure is made of an insulation material, a gap may be disposed between the cover-shaped structure and the conductive part, or no gap may be disposed.

Optionally, the insulation material includes an insulation adhesive, a fiber product, insulation rubber, insulation plastic and a product thereof, glass, insulation ceramic, and the like.

With reference to the first aspect, in a possible implementation, the conductive part is a conductive sheet.

With reference to the first aspect, in a possible implementation, the conductive sheet is a preformed sheet-like structure.

It should be understood that the preformed sheet-like structure may be formed separately from the printed circuit board, instead of being formed directly on the printed circuit board.

With reference to the first aspect, in a possible implementation, when the conductive sheet is a preformed sheet-like structure, the conductive sheet is connected to the printed circuit board by using solder or a conductive adhesive.

With reference to the first aspect, in a possible implementation, the conductive sheet is a sheet-like structure formed after solder is cured, or a sheet-like structure formed after a conductive adhesive is cured.

When the conductive sheet is a sheet-like structure formed by curing a solder fluid, the conductive sheet may be directly formed on the printed circuit board.

When the conductive sheet is a sheet-like structure formed by curing the conductive adhesive, the conductive sheet may be directly formed on the printed circuit board.

When the conductive sheet is a sheet-like structure formed by curing solder or a conductive adhesive, there is no need to additionally solder the sheet-like structural part, so that a process may be simplified, costs of an additional sheet-like structure can be reduced, and the conductive sheet can be disposed by using the existing process.

In addition, when the solder or the conductive adhesive is used as the conductive part, a thickness of the conductive part may be made very small, for example, less than 0.2 mm. In this way, overall heights of the conductive part and the cover-shaped structure are reduced, which may occupy less internal space.

With reference to the first aspect, in a possible implementation, a material of the conductive part is any one of the following: a metal material of single composition, an alloy material, or a conductive composite material.

Optionally, metal of single composition includes copper, aluminum, silver, and the like.

Optionally, an alloy includes a copper alloy (also referred to as a copper-nickel-zinc alloy), an aluminum alloy, and the like.

Optionally, the conductive composite material includes conductive plastic, conductive rubber, conductive fiber fabric, conductive coating, a conductive adhesive, and the like.

With reference to the first aspect, in a possible implementation, the conductive part is fixedly connected to the printed circuit board.

With reference to the first aspect, in a possible implementation, the cover-shaped structure is fixedly connected to the printed circuit board.

With reference to the first aspect, in a possible implementation, the printed circuit board includes a first circuit board part and a second circuit board part that are separable. The first circuit board part includes a first connection region, a second connection region disposed around the first connection region, and an extension region extending outwards from the second connection region. The first connection region is connected to the conductive part. The second connection region and the extension region are connected to the cover-shaped structure. The extension region and the second circuit board part are disposed in a staggered manner.

In this embodiment of this application, the extension region of the first circuit board part can increase a contact area between the cover-shaped structure and the printed circuit board, thereby further enhancing mechanical strength of the circuit board and improving mechanical reliability of the circuit board.

In addition, the extension region of the first circuit board part and the second circuit board part are disposed in a staggered manner, and correspondingly, the cover-shaped structure and the second circuit board part are disposed in a staggered manner, so that mechanical reliability of the circuit board may be further improved.

With reference to the first aspect, in a possible implementation, the printed circuit board includes a transverse wide region and a narrow strip region that extends longitudinally, a width of the narrow strip region is less than that of the wide region, and the conductive part and the cover-shaped structure are disposed on the narrow strip region.

In this embodiment of this application, the circuit board may be an L-shaped circuit board. The conductive part and the cover-shaped structure are disposed on the narrow strip region, which may reduce impedance of the narrow strip region, and improve heat dissipation of the narrow strip region, mechanical strength of the narrow strip region, and reliability.

With reference to the first aspect, in a possible implementation, the functional network includes a charging circuit and/or a power supply circuit.

Optionally, the charging circuit is a voltage bus (voltage bus, VBUS) circuit.

Optionally, the power supply circuit is a network that supplies power to a display panel of the electronic device, a network that supplies power to an audio module of the electronic device, or the like.

With reference to the first aspect, in a possible implementation, the printed circuit board is a circuit board having a charging function.

Optionally, a contact area between the conductive part and the printed circuit board is greater than a first threshold. Herein, selection of the first threshold may be determined according to actual needs. That is, the contact area between the conductive part and the printed circuit board can meet a requirement of enhancing mechanical strength of the circuit board so that no circuit breakage or even board breakage occurs.

According to a second aspect, a printed circuit board assembly is provided, including: a printed circuit board, where the printed circuit board includes a functional network, and the functional network is configured to provide an electrical function; and a conductive part, where the conductive part is connected to the printed circuit board and is electrically connected in parallel to the functional network, and an exposed surface of the conductive part is coated with an insulation layer.

The printed circuit board assembly provided in this embodiment of this application includes the conductive part electrically connected in parallel to the functional network, and the conductive part may transmit a current. In this way, the conductive part provides a path for the current in the functional network, and impedance of the circuit board can be reduced. Correspondingly, impedance of the circuit board is reduced, heat generated is accordingly reduced, and a current utilization can be improved. Further, heat generated by the circuit board is reduced, and a temperature of the circuit board decreases. In this way, a temperature of another component that conducts heat of the circuit board, for example, a housing of the electronic device, is reduced, and heat dissipation of the electronic device can be further improved, thereby improving user experience.

The conductive part is coated with an insulation layer, so that the conductive part may be isolated from a surrounding metal structural part, thereby preventing a short circuit caused by contact between the conductive part and the surrounding metal part.

In addition, a design of the conductive part can enhance mechanical reliability of the circuit board and reduce a risk of board breakage.

Further, if an insulation layer is coated on the conductive part, a dedicated anti-short circuit structure separated from the conductive part does not need to be disposed on the circuit board, thereby reducing a thickness of the circuit board, reducing costs of a dedicated anti-short circuit design separated from the conductive part, and avoiding a soldering short-circuit problem between the conductive part and the anti-short circuit structure.

Optionally, the conductive part may be a sheet-like structure, or may be a cover-shaped structure.

When the conductive part is a sheet-like structure, a non-connection surface of the sheet-like structure is coated with an insulation layer. The non-connection surface is a surface on the sheet-like structure other than a surface connected to the printed circuit board.

When the conductive part is a cover-shaped structure, an exposed surface of the cover-shaped structure is coated with an insulation layer.

With reference to the second aspect, in a possible implementation, the conductive part is a conductive sheet or a cover-shaped structure.

With reference to the second aspect, in a possible implementation, the conductive sheet is a preformed sheet-like structure.

With reference to the second aspect, in a possible implementation, when the conductive sheet is a preformed sheet-like structure, the conductive sheet is connected to the printed circuit board by using solder or a conductive adhesive.

With reference to the second aspect, in a possible implementation, the conductive sheet is a sheet-like structure formed after solder is cured, or a sheet-like structure formed after a conductive adhesive is cured.

With reference to the second aspect, in a possible implementation, a material of the conductive part is any one of the following: a metal material of single composition, an alloy material, or a conductive composite material.

With reference to the second aspect, in a possible implementation, the conductive part is fixedly connected to the printed circuit board.

With reference to the second aspect, in a possible implementation, the printed circuit board includes a transverse wide region and a narrow strip region that extends longitudinally, a width of the narrow strip region is less than that of the wide region, and the conductive part is disposed on the narrow strip region.

With reference to the second aspect, in a possible implementation, the functional network includes a charging circuit and/or a power supply circuit.

With reference to the second aspect, in a possible implementation, the printed circuit board is a circuit board having a charging function.

According to a third aspect, an electronic device is provided, including the printed circuit board assembly according to any one of the first aspect, the second aspect, or the possible implementations of the first aspect or the second aspect.

Optionally, the electronic device includes a mobile phone, a watch, a wristband, a tablet computer, and the like.

REFERENCE NUMERALS

10: housing; 11: bezel; 12: middle frame; 13: rear cover; 101: first surface; 102: second surface; 103: first cavity; 104: second cavity; 20: display panel; 30: printed circuit board; 31: L-shaped circuit board; 301: main body region; 302: narrow strip region; 303: part with a minimum width on the narrow strip region; 304: reinforcement region in which no reinforcement structure is disposed; 304a: first connection region; 304b: second connection region; 304c: extension region; 305: stainless steel sheet; 306: reinforcement region in which a conductive sheet is disposed; 308: reinforcement region in which a reinforcement structure is disposed; 311: conductive sheet; 312: cover-shaped structure; 313: insulation layer; 32: printed circuit board; 321: first circuit board part; 322: second circuit board part; 40: circuit board bracket; 51: battery; 52: charging management module; 61: charging interface; 62: flexible printed circuit; 63: charging interface board-to-board connector; and 64: battery board-to-board connector.

DESCRIPTION OF EMBODIMENTS

The following describes technical solutions of this application with reference to the accompanying drawings.

The terms "first" and "second" in embodiments of this application are merely intended for a purpose of description, and shall not be understood as an indication or implication of relative importance or implicit indication of a quantity of indicated technical features. Therefore, a feature defined by "first" or "second" may explicitly or implicitly include one or more features.

In the description of embodiments of this application, orientation or position relationships indicated by the terms such as "up", "down", "inside", and "outside" are defined relative to orientations or positions in which components are schematically placed in the accompanying drawings. It should be understood that these orientation terms are relative concepts and are used for relative description and clarification, rather than indicating or implying that an indicated apparatus or element needs to have a particular orientation, or be constructed and operated in a particular orientation. These orientation terms may change accordingly based on changes of the orientations in which the components are placed in the accompanying drawings, and therefore cannot be construed as a limitation on this application.

Figure 1:
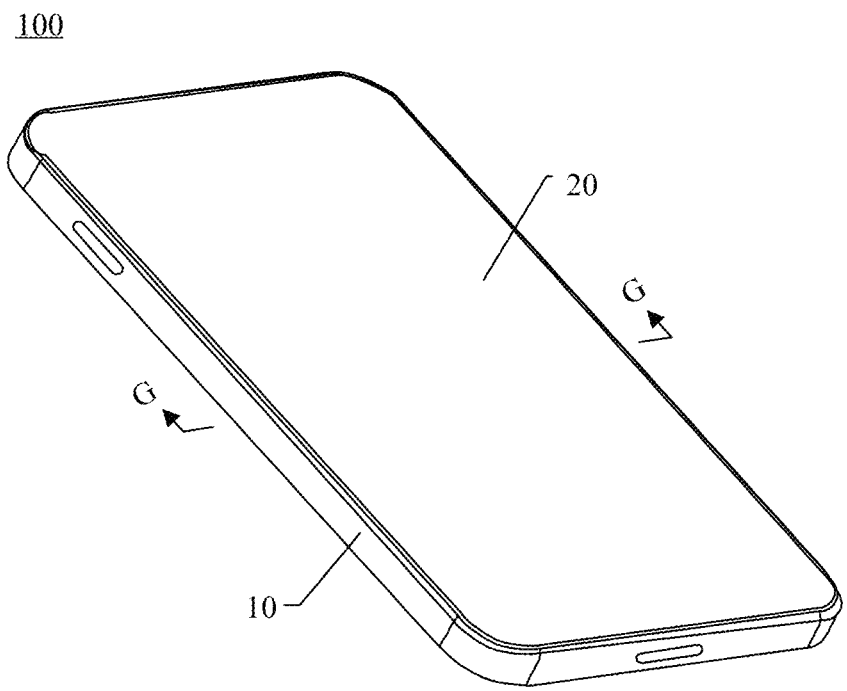
FIG. 1 is a schematic diagram of a structure of an electronic device.
Figure 2:
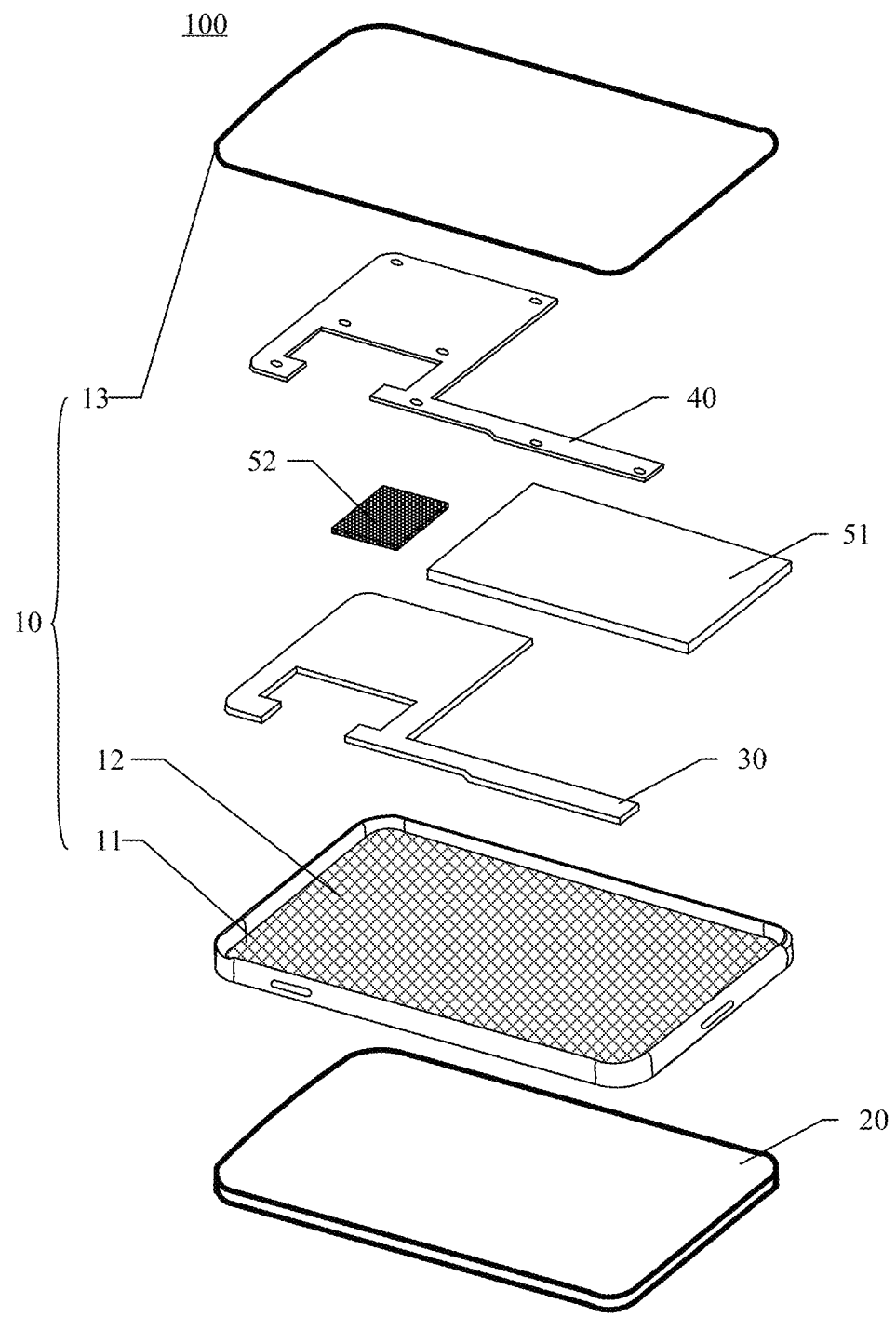
FIG. 2 is a schematic exploded view of the electronic device in FIG. 1.
Figure 3:
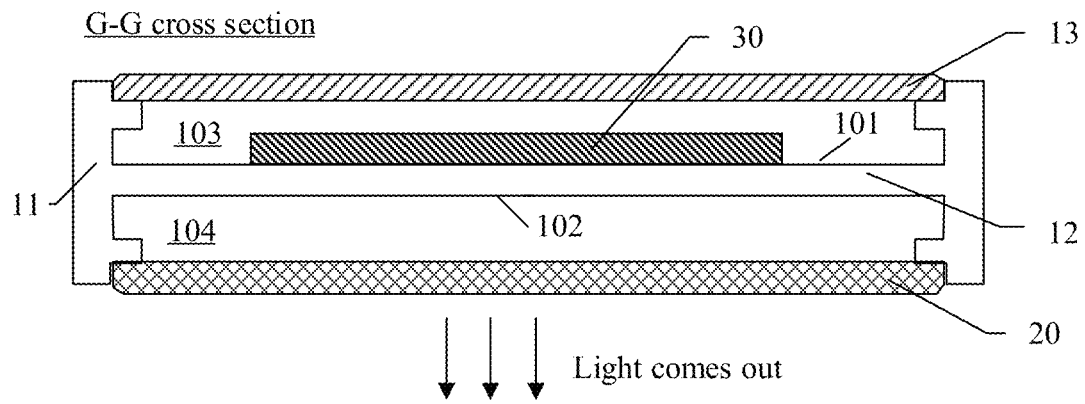
FIG. 3 is a schematic cross-sectional view of the electronic device in FIG. 1 cut along a line B-B.

FIG. 1 is a schematic diagram of a structure of an electronic device 100. FIG. 2 is a schematic exploded view of the electronic device 100 in FIG. 1. FIG. 3 is a schematic cross-sectional view of the electronic device 100 in FIG. 1 cut along a line G-G.

It should be understood that FIG. 1 to FIG. 3 merely schematically show some components included in the electronic device 100. Shapes, sizes, and structures of these components are not limited by FIG. 1 to FIG. 3. In some other embodiments, the electronic device 100 may further include more or fewer components than those shown in the figure. This is not limited in this embodiment of this application. In some other embodiments, a type of the electronic device 100 is different and components included in the electronic device 100 are different. A structure of the electronic device provided in this embodiment of this application is merely an example for description.

The electronic device 100 in this embodiment of this application may be a handheld device, a vehicle-mounted device, a wearable device, a computing device, or another processing device connected to a wireless modem. The electronic device 100 includes but is not limited to a cellular phone (cellular phone), a smartphone (smartphone), a personal digital assistant (personal digital assistant, PDA) computer, a tablet computer, a laptop, a laptop computer (laptop computer), and a smart watch (smart watch), a smart wristband (smart wristband), a vehicle-mounted computer, another electronic device, and the like. A specific form of the electronic device 100 is not specially limited in this embodiment of this application. For ease of description and understanding, the following uses an example in which the electronic device 100 is a terminal device such as a mobile phone for description.

With reference to FIG. 1 and FIG. 2, the electronic device 100 may include a housing 10, a display panel (display panel, DP) 20, a printed circuit board (printed circuit board, PCB) 30, and a circuit board bracket 40.

An accommodation space is formed in the housing 10, and is configured to accommodate components of the electronic device 100. The housing 10 may further protect the electronic device 100 and support the entire device. The display panel 20, the printed circuit board 30, and the circuit board bracket 40 are disposed in the accommodation space of the housing 10, and are connected to the housing 10.

Specifically, with reference to FIG. 2 and FIG. 3, the housing 10 may include a bezel 11, a middle frame 12, and a rear cover 13.

The middle frame 12 is a support frame located inside the electronic device 100, is generally made of a metal material, and may be used as a ground (ground, GND) terminal of the electronic device 100. The display panel 20 and the rear cover 13 are disposed on two sides of the middle frame 12.

As shown in FIG. 3, the middle frame 12 includes a first surface 101 and a second surface 102 that are disposed opposite each other. The first surface 101 is close to the rear cover 13, and the second surface 102 is close to the back of the display panel 20. A first cavity 103 may be formed between the rear cover 13 and the middle frame 12, a second cavity 104 may be formed between the display panel 20 and the middle frame 12, and the first cavity 103 and the second cavity 104 form the accommodation space described above. The first cavity 103 may be configured to install internal elements such as a battery, a printed circuit board, a functional module, a camera, and an antenna. The second cavity 104 may be arranged with a vibrating element to emit a sound on a display, another element to be disposed between the middle frame 12 and the display panel 20, or the like.

It should be noted that the display panel 20 has an out-light surface that can display an image. A back surface of the display panel 20 in this embodiment of this application is a surface on a side of the display panel 20 that is disposed opposite the out-light surface, that is, a surface on a side of the display panel 20 that is close to the middle frame 12, or a surface of the display panel 20 that is opposite the second surface 102 of the middle frame 12.

The bezel 11 is a structure that encircles an outer periphery of the electronic device 100. With reference to FIG. 2, the bezel 11 may extend around the peripheries of the electronic device 100 and the display panel 20, and may specifically surround four sides of the display panel 20, to help fasten the display panel 20. In some embodiments, the bezel 11 may be a metal bezel, and the metal bezel is made of a metal material such as copper, a magnesium alloy, or stainless steel. In some other embodiments, the bezel 11 may alternatively be a non-metal bezel (that is, an insulation bezel), and the non-metal bezel includes a plastic bezel, a glass bezel, a ceramic bezel, and the like.

The rear cover 13 is a structure disposed opposite the display panel 20 on the electronic device 100, is connected to the bezel 11, and is configured to seal components of the electronic device 100 inside the electronic device. In addition, the rear cover 13 can further prevent dust, collision, and hardware scratches. The rear cover 13 may be a rear cover made of a metal material (that is, a metal rear cover), or may be a rear cover made of a non-conductive material (that is, a non-metal rear cover), such as a glass rear cover or a plastic rear cover.

The middle frame 11 and the bezel 12 may be of a separate structure, or may be of an integral structure. This is not limited in this embodiment of this application. When the middle frame 11 and the bezel 12 are of a separate structure, the middle frame 11 and the bezel 12 are two different components of the housing 10. The middle frame 11 and the bezel 12 may be assembled in a manner such as clamping or snap-fitting, and may be separated when disassembly is required. When the middle frame 11 and the bezel 12 are of an integral structure, the middle frame 11 and the bezel 12 cannot be separated. For example, the middle frame 11 and the bezel 12 are manufactured in an integrally molding manner, or assembled in a permanent connection manner such as soldering. For an integral middle frame and bezel, it may be considered that an outer periphery of the middle frame serves as a bezel of the electronic device 100.

The bezel 12 and the rear cover 13 may be of a separate structure, or may be of an integral structure. This is not limited in this embodiment of this application. When the bezel 12 and the rear cover 13 are of a separate structure, the bezel 12 and the rear cover 13 are two different components of the housing 10. The bezel 12 and the rear cover 13 may be assembled in a manner such as clamping or fastening or snap-fitting, and may be separated when disassembly is required. When the bezel 12 and the rear cover 13 are of an integral structure, a connection relationship between the bezel 12 and the rear cover 13 cannot be split. For example, the bezel 12 and the rear cover 13 are manufactured in an integrally molding manner, or assembled in a permanent connection manner such as soldering. For an integral bezel and rear cover, it may be considered that an outer periphery of the rear cover 13 serves as a bezel of the electronic device 100.

With reference to FIG. 2, the display panel 20 and the rear cover 13 are respectively disposed on two sides of the middle frame 12, and are each connected to the middle frame 12. The printed circuit board 30 and the circuit board bracket 40 are disposed between the middle frame 12 and the rear cover 13, the printed circuit board 30 is close to the middle frame 12, and the circuit board bracket 40 is close to the rear cover 13. The circuit board bracket 40 is connected to the middle frame 12, and the printed circuit board 30 located between the circuit board bracket 40 and the middle frame 12 may be fastened.

The display panel 20 is configured to display an image. The display panel 20 may be a liquid crystal display (liquid crystal display, LCD), an organic light emitting diode (organic light emitting diode, OLED) display, or the like. The OLED display may be a flexible display or a rigid display. The display panel 20 may be a common regular screen, or may be a special-shaped screen, a foldable screen, or the like. For example, the display panel 20 may relatively freely rotate or fold to form an arc, multi-prism, or the like.

The printed circuit board 30 is a support for electronic components, and is also used as a carrier for electrical connections for the electronic components. The printed circuit board 30 has a function of supporting and interconnecting circuit elements. The electronic components include but are not limited to a capacitor, an inductor, a resistor, a processor, a memory, a camera, a flash, a microphone, a battery, an antenna, and the like.

Generally, a printed circuit board on which no electronic component is soldered may be referred to as a PCB. A printed circuit board on which electronic components are soldered may be referred to as a printed circuit board assembly (printed circuit board assembly, PCBA).

The printed circuit board 30 may use an FR-4 dielectric board, a Rogers (rogers) dielectric board, a hybrid dielectric board of Rogers and FR-4, or the like. Herein, FR-4 is a grade designation for a flame resistant material, and the Rogers dielectric board is a high-frequency board. The printed circuit board 30 may be a single-sided board, a double-sided board, a multi-layer circuit board, or the like. The printed circuit board 30 may be a ceramic circuit board, an alumina ceramic circuit board, an aluminum nitride ceramic circuit board, an aluminum substrate, a high-frequency board, a heavy copper board, an impedance board, or the like. In some embodiments, the printed circuit board 30 may also be referred to as a main board.

Conductive patterns are disposed on the printed circuit board 30, and electronic components may be electrically connected by routing between different conductive patterns. The printed circuit board 30 after routing may include a functional network and a non-functional network. The functional network may provide an electrical function, such as a charging, radio frequency, antenna, multimedia, data storage, or sensor function. The non-functional network cannot provide electrical functions, and is mainly used to implement a purpose such as mechanical connection between a soldered structural part and the PCB. The non-functional network is usually grounded (ground, GND) or floats (not connected to any functional network or GND network), and is configured to isolate a structural part carried on the printed circuit board 30 from the functional network, to avoid electric shocks or device damage caused by mistaken contact. For example, a PCB pad corresponding to a metal cover on a side that is of the printed circuit board and that is close to the housing 10 may be disposed as a GND metal layer, and the metal layer may be formed by etching metal on a surface of the printed circuit board 30. The metal layer is a part of the non-functional network.

The circuit board bracket 40 is disposed between the printed circuit board 30 and the housing 10 (specifically, the rear cover 13), and is mainly configured to fasten the printed circuit board 30 to the housing 10 (specifically, the middle frame 12). The circuit board bracket 40 may be made of metal and used as a conductive GND. The circuit board bracket 40 may also be an insulation bracket, and a metal part may be disposed on the insulation support.

Electronic components carried on the printed circuit board 30 may form a plurality of function modules to implement corresponding functions. For example, a charging management module is configured to receive charging input from a charger, a power management module is configured to supply power to a display and the like, a wireless communication module and a mobile communication module are configured to implement a communication function of the electronic device, and an audio module is configured to implement an audio function and the like. A shape of the printed circuit board 30 may be correspondingly designed based on a shape of the electronic device, and positions, shapes, and the like of the function modules to be disposed inside the electronic device.

Figure 4:
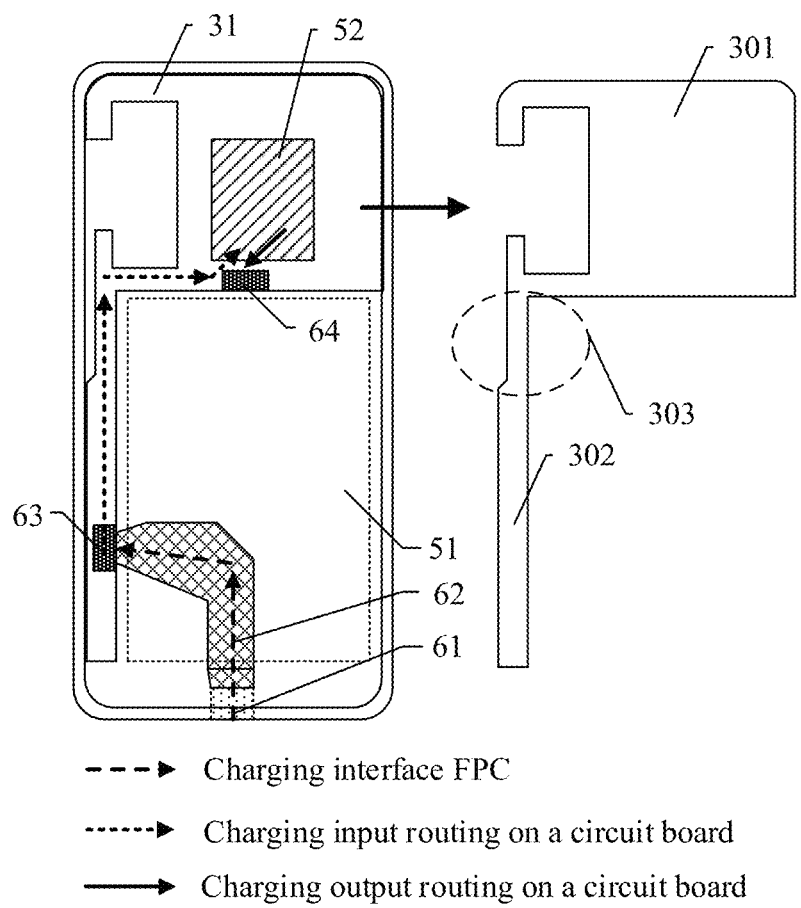
FIG. 4 is a schematic top view of an internal structure of the electronic device in FIG. 1.

FIG. 2 shows an example of a battery 51, a charging management module 52, and a schematic structure of a printed circuit board 30. FIG. 4 is a schematic diagram of installation positions of the printed circuit board 30, the battery 51, and the charging management module 52.

With reference to FIG. 4, to install the battery 51, a structure of the printed circuit board may be designed to be L-shaped, for example, an L-shaped circuit board 31. As shown in the figure, the L-shaped circuit board 31 includes a transverse main body region 301 and a narrow strip region 302 that extends longitudinally from the main body region 301. The main body region 301 and the narrow strip region 302 are disposed around the battery 51. Herein, relative to the narrow strip region 302, the main body region 301 belongs to a wide region, that is, a width of the main body region 301 is greater than that of the narrow strip region 302.

The charging management module 52 connected to the circuit board is disposed in the main body region 301 of the L-shaped circuit board 31. A charging interface board-to-board connector (board-to-board, connector, BTB) (charging interface BTB for short) 63 and a battery board-to-board connector (battery BTB for short) 64 are disposed on the L-shaped circuit board 31. The charging interface BTB 63 is configured to connect a charging interface 61 and the circuit board 31, and the battery BTB 64 is configured to connect the battery 51 and the circuit board 31.

The charging interface 61 is disposed at an edge of the electronic device, and the charging interface 61 may be connected to the charging interface BTB 63 by using a flexible printed circuit (flexible printed circuit, FPC) board 62. The charging interface 61 may be a mini (mini) universal serial bus (universal serial bus, USB) interface, a micro (micro) USB interface, a type-A (type-A) USB interface, a type-B (type-B) USB interface, or a type-C (type-C) USB interface. It should be understood that a specific type of the charging interface 61 may be correspondingly selected based on different types of the electronic device. This is not limited herein.

FIG. 4 further schematically shows a charging path on a circuit board. The charging interface 61 may be connected to an external power supply. For example, the charging interface 61 is connected to an external 220 V power socket by using a charging circuit and a charging adapter. The charging interface 61 may obtain a voltage/current for charging the battery 51 from an external power supply. The voltage/current is transferred to the charging management module 52 through the flexible printed circuit 62, the charging interface BTB 63, and the circuit board 31 in sequence. The charging management module 52 may convert a voltage obtained from the outside into a voltage of the battery 51, and charge the battery 51 through the battery BTB 64 precisely and controllably based on a required charging current.

In addition, when electricity is stored, the battery 51 can supply power to the electronic component installed on the circuit board 31 through the battery BTB 64. For example, the battery 51 may supply power to the display to maintain brightness, a refresh rate, and the like of the display, may supply power to the audio module to emit a sound, or may supply power to the communication module to transmit a radio frequency signal and the like.

In a charging process, a charging current of the battery 51 needs to be transferred through a charging circuit on the circuit board. In a discharging process, a power supply current of the battery 51 needs to be transferred through a power supply circuit on the circuit board.

Currently, a printed circuit board is disposed in most electronic devices to implement electrical interconnection of electronic components. Because an internal structure of the electronic device is relatively complex, a shape of the printed circuit board for carrying electronic components also needs to be correspondingly designed according to actual needs. When a shape of the printed circuit board is an irregular design, there are generally parts with a relatively narrow width on the printed circuit board, for example, a narrow strip region 302 of the L-shaped circuit board 31 shown in FIG. 4, or a part 303 with a minimum width on the narrow strip region 302.

In these parts with a relatively narrow width, mechanical strength of the circuit board is insufficient, the circuit board is prone to breakage, and there is a problem of mechanical reliability.

In addition, in these parts with a relatively narrow width, a cross-sectional area through which the current flows is relatively small. According to a resistance calculation formula R=ρL/S (where ρ represents a resistivity of a resistor, L represents a length of the resistor, and S represents a cross-sectional area of the resistor), it may be learned that impedance at these positions is usually large, and there is an impedance bottleneck. When a relatively large current passes through, a circuit board in these parts generates a large amount of heat, and most energy is consumed in a form of heat. As a result, current utilization efficiency is low, a temperature of the housing of the electronic device is excessively high, and the like.

Figure 5:
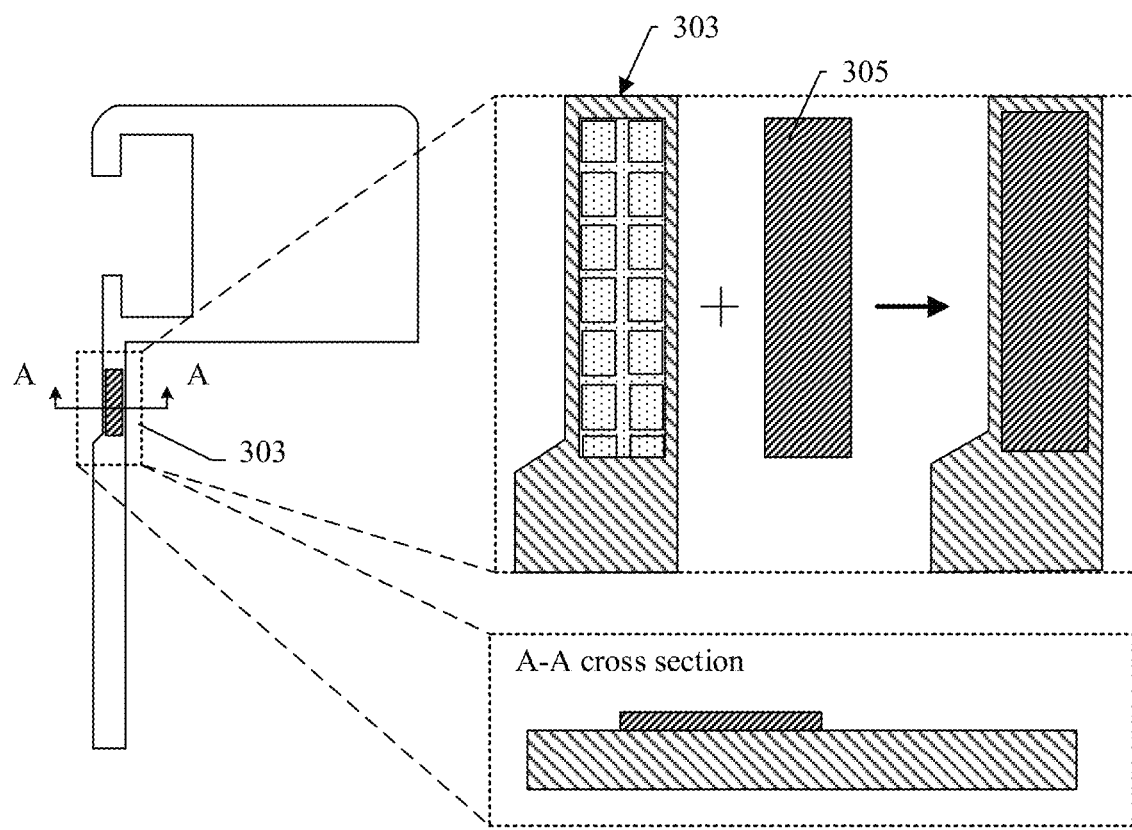
FIG. 5 is a schematic diagram of a structure of an existing reinforcement structure.

FIG. 5 is a schematic diagram of a structure of an existing reinforcement structure. As shown in FIG. 5, there is a region 303 with a relatively narrow width on the circuit board. To resolve a problem of mechanical reliability of the circuit board, a stainless steel sheet 305 may be soldered on the region 303, so as to enhance strength of the circuit board and reduce a risk of breaking the circuit board. In addition, to avoid abnormal electrical functions or performance caused by contact or proximity between the stainless steel sheet 305 and the conductive circuit board bracket or middle frame, the stainless steel sheet 305 of the reinforcement structure is usually grounded (ground, GND).

However, this solution of soldering the stainless steel sheet can only improve the mechanical reliability of the circuit board, but cannot improve electrical performance of the circuit board. Therefore, an embodiment of this application provides a reinforcement structure, which can not only improve the mechanical reliability of the circuit board, but also reduce impedance of the circuit board and improve a current utilization.

Figure 6:
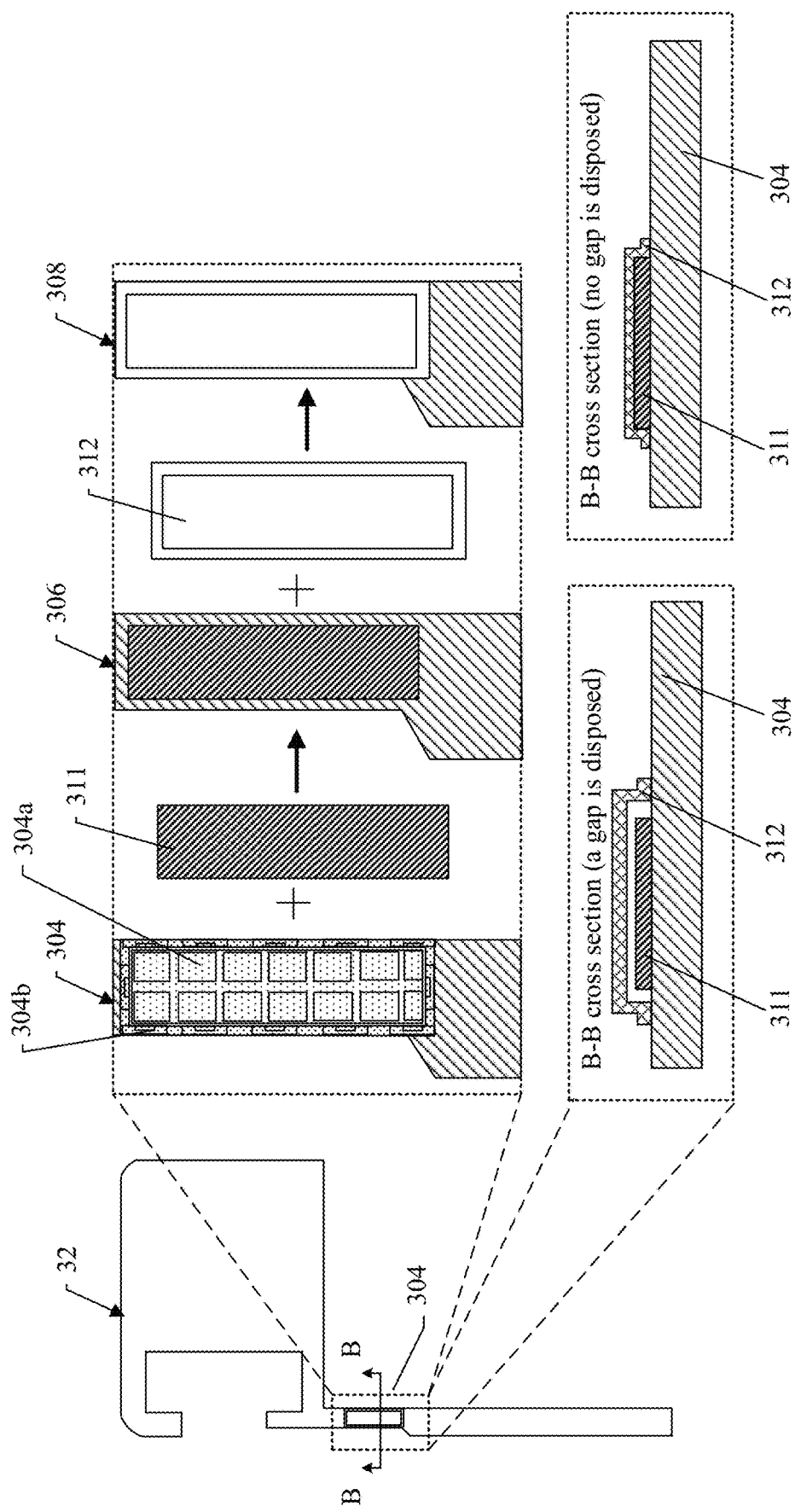
FIG. 6 is a schematic diagram of a structure of a reinforcement structure according to an embodiment of this application.

FIG. 6 is a schematic diagram of a structure of a reinforcement structure according to an embodiment of this application.

For ease of description, in the following embodiment, a region in which a reinforcement structure needs to be disposed on the printed circuit board is referred to as a reinforcement region. In this embodiment of this application, the reinforcement region may be a region with relatively high impedance on the printed circuit board, for example, a region with a relatively narrow width on the printed circuit board or a region with a relatively long path through which a current flows on the printed circuit board. Alternatively, the reinforcement region may be a region through which a large current passes on the printed circuit board, or the like.

As shown in FIG. 6, the reinforcement structure in this embodiment of this application includes a conductive sheet 311 and a cover-shaped structure 312.

The conductive sheet 311 is a preformed sheet-like structure, and is configured to provide a path for the current.

The cover-shaped structure 312 is a hollow cover-shaped structure, on which an accommodation space is formed. The accommodation space is used to accommodate the conductive sheet 311. The cover-shaped structure 312 is configured to isolate the conductive sheet 311 from a surrounding metal structural part, to prevent a short circuit.

The printed circuit board 32 includes a reinforcement region 304. With reference to an enlarged schematic diagram shown in FIG. 6, the reinforcement region 304 includes a first connection region 304a and a second connection region 304b, and the second connection region 304b is disposed around the first connection region 304a.

The first connection region 304a is configured to connect the conductive sheet 311, and the conductive sheet 311 is disposed in parallel to (for example, attached to) the first connection region 304a. A structure obtained after the conductive sheet 311 is disposed on the reinforcement region 304 is shown in a reinforcement region 306 in FIG. 6. In this embodiment of this application, the first connection region 304a is connected to a functional network on the printed circuit board 32, the conductive sheet 311 is electrically connected to the first connection region 304a, and the conductive sheet 311 is electrically connected in parallel to the functional network on the printed circuit board 32.

Therefore, when a current passes through a circuit network electrically connected to the conductive sheet 311, the current also flows through the conductive sheet 311. The conductive sheet 311 provides a path for the current in the functional network, which is equivalent to increasing a cross-sectional area through which the current flows. It can be learned from the foregoing resistance calculation formula that the conductive sheet 311 can reduce impedance of the reinforcement region 304. Impedance of the reinforcement region 304 is reduced, and heat generated in the reinforcement region 304 is reduced, so that a temperature of the circuit board 32 can be reduced, thereby reducing a temperature of another component that conducts heat of the circuit board, for example, a housing of the electronic device, and improving heat dissipation of the electronic device and user experience. The heat generated by the circuit board is reduced, and a current utilization is improved accordingly.

The second connection region 304b is configured to connect the cover-shaped structure 312. The cover-shaped structure 312 covers the conductive sheet 311. That is, when the cover-shaped structure 312 is disposed on the second connection region 304b, an accommodation space, such as a closed accommodation space, is formed between the cover-shaped structure 312 and the printed circuit board 32, and the conductive sheet 311 disposed on the first connection region 304a is accommodated in the accommodation space. A structure obtained after the cover-shaped structure 312 is disposed on the reinforcement region 306 is shown in a reinforcement region 308 in the figure. Because the conductive sheet 311 is connected to the functional network of the printed circuit board 32, the cover-shaped structure 312 in this embodiment of this application may isolate the conductive sheet 311 from a surrounding metal structural part, to prevent a short circuit caused by contact between the conductive sheet 311 and the surrounding metal part. In other words, the cover-shaped structure 312 is an anti-short circuit structure.

The conductive sheet 311 and the cover-shaped structure 312 that are disposed on the reinforcement region 304 can enhance mechanical reliability of the circuit board and reduce a risk of board breakage. In addition, compared with the stainless steel sheet in the conventional technology, the hollow cover-shaped structure 312 has a stronger anti-deformation capability. Therefore, compared with a manner of using the stainless steel sheet for reinforcement in the conventional technology, a manner of using the cover-shaped structure for reinforcement in this embodiment of this application can significantly improve the mechanical reliability of the circuit board.

In this embodiment of this application, the conductive sheet 311 is a high conductivity sheet-like structure. A material of the conductive sheet 311 may be metal (for example, copper, aluminum, or silver) of single composition, or may be an alloy (for example, a copper alloy (also referred to as a copper-nickel-zinc alloy) or an aluminum alloy), or may be a conductive composite material (for example, conductive plastic, conductive rubber, conductive fiber fabric, conductive coating, or a conductive adhesive).

Optionally, the conductive sheet 311 is fixedly connected to the printed circuit board 32. A fixed connection manner may include but is not limited to soldering, bonding, screwed connection, and the like, as long as the conductive sheet 311 and the printed circuit board 32 can be secured together.

For example, the conductive sheet 311 may be connected to the printed circuit board 32 by using solder (for example, alloy solder) or a conductive adhesive. For example, the first connection region 304a of the reinforcement region 304 includes a first pad configured to connect the conductive sheet 311, and the first pad is connected to the functional network on the printed circuit board 32. The conductive sheet 311 may be connected to the printed circuit board 32 in a soldering manner, and is electrically connected in parallel to the functional network on the printed circuit board 32 by using the first pad.

It should be understood that a thickness of the conductive sheet 311 may be determined according to actual needs such as internal space of the electronic device, a tolerable risk of board breakage, and an electrical performance indicator (for example, an impedance indicator, a housing temperature, or current utilization efficiency) to be satisfied. This is not specifically limited in this embodiment of this application.

A thickness of the conductive sheet 311 may be even or uneven. This is not limited in this embodiment of this application.

In this embodiment of this application, a material of the cover-shaped structure 312 may be a conductive material. The conductive material includes but is not limited to metal (for example, copper, aluminum, or silver) of single composition, an alloy (for example, a copper alloy (also referred to as a copper-nickel-zinc alloy), or an aluminum alloy), or a conductive composite material (for example, conductive plastic, conductive rubber, conductive fiber fabric, conductive coating, or a conductive adhesive). In some embodiments, a material of the cover-shaped structure 312 may be the same as that of the conductive sheet 311. A material of the cover-shaped structure 312 may alternatively be an insulation material. The insulation material includes but is not limited to an insulation adhesive, a fiber product, insulation rubber, insulation plastic and a product thereof, glass, insulation ceramic, and the like.

Optionally, the cover-shaped structure 312 is fixedly connected to the printed circuit board 32. A fixed connection manner may include but is not limited to soldering, bonding, screwed connection, and the like, as long as the cover-shaped structure 312 and the printed circuit board 32 can be secured together.

For example, the cover-shaped structure 312 may be connected to the printed circuit board 32 by using solder (for example, alloy solder), a conductive adhesive, or an insulation adhesive. It should be understood that the cover-shaped structure 312 and the printed circuit board 32 include a solder layer or an adhesive layer, which is not shown in FIG. 6.

As an example, the second connection region 304b of the reinforcement region 304 includes a second pad configured to connect the cover-shaped structure 312. With reference to FIG. 6, the cover-shaped structure 312 may be connected to the second pad in a soldering manner. In this case, the cover-shaped structure 312 may be made of a metal material that can perform soldering.

Optionally, when the cover-shaped structure 312 is made of a metal material, the cover-shaped structure 312 may be connected to a ground network of the printed circuit board 32 by using the second pad, or may be in a floating state, that is, not connected to any network on the printed circuit board 32. In this embodiment of this application, when the cover-shaped structure is in the floating state, the cover-shaped structure is not electrically connected to the functional network or the GND network.

As another example, a conductive adhesive may be disposed on the second connection region 304b of the reinforcement region 304, and the cover-shaped structure 312 is connected to the printed circuit board 32 by using the conductive adhesive. In this case, the cover-shaped structure 312 may be made of a metal material, or may be made of an insulation material.

Optionally, when the cover-shaped structure 312 is made of a metal material, the cover-shaped structure 312 may be connected to a ground network of the printed circuit board 32 by using the conductive adhesive, or may be in a floating state, that is, not connected to any network on the printed circuit board 32.

As another example, an insulation adhesive may be disposed on the second connection region 304b of the reinforcement region 304, and the cover-shaped structure 312 is connected to the printed circuit board 32 by using the insulation adhesive.

In this embodiment of this application, a gap may be disposed between the cover-shaped structure 312 and the conductive sheet 311, or no gap may be disposed, which needs to be specifically determined based on a material of the cover-shaped structure 312.

For example, when the cover-shaped structure 312 is made of a metal material, a gap needs to be disposed between the cover-shaped structure 312 and the conductive sheet 311. With reference to a schematic cross-sectional view (a gap is disposed) of the reinforcement region cut along a line B-B in FIG. 6, the cover-shaped structure 312 is not in contact with the conductive sheet 311. The gap between the cover-shaped structure 312 and the conductive sheet 311 may be designed according to actual needs. For example, the gap may be greater than 0.2 mm.

Optionally, an insulation filler may be disposed in the gap between the cover-shaped structure 312 and the conductive sheet 311.

For another example, when the cover-shaped structure 312 is made of an insulation material, a gap may be disposed between the cover-shaped structure 312 and the conductive sheet 311. With reference to the schematic cross-sectional view (a gap is disposed) of the reinforcement region cut along a line B-B in FIG. 6, a size of the gap may be designed based on a size of space inside the electronic device. For example, the gap is greater than 0. Certainly, no gap may also be disposed between the cover-shaped structure 312 and the conductive sheet 311. With reference to a schematic cross-sectional view (no gap is disposed) of the reinforcement region cut along a line B-B in FIG. 6, the cover-shaped structure 312 may be in direct contact with the conductive sheet 311.

It should be understood that a thickness of the cover-shaped structure 312 may be determined according to actual needs such as internal space of the electronic device, a tolerable risk of board breakage, and an electrical performance indicator (for example, a heat dissipation effect) to be satisfied. This is not specifically limited in this embodiment of this application.

A thickness of the cover-shaped structure 312 may be even or uneven. This is not limited in this embodiment of this application.

Figure 7:
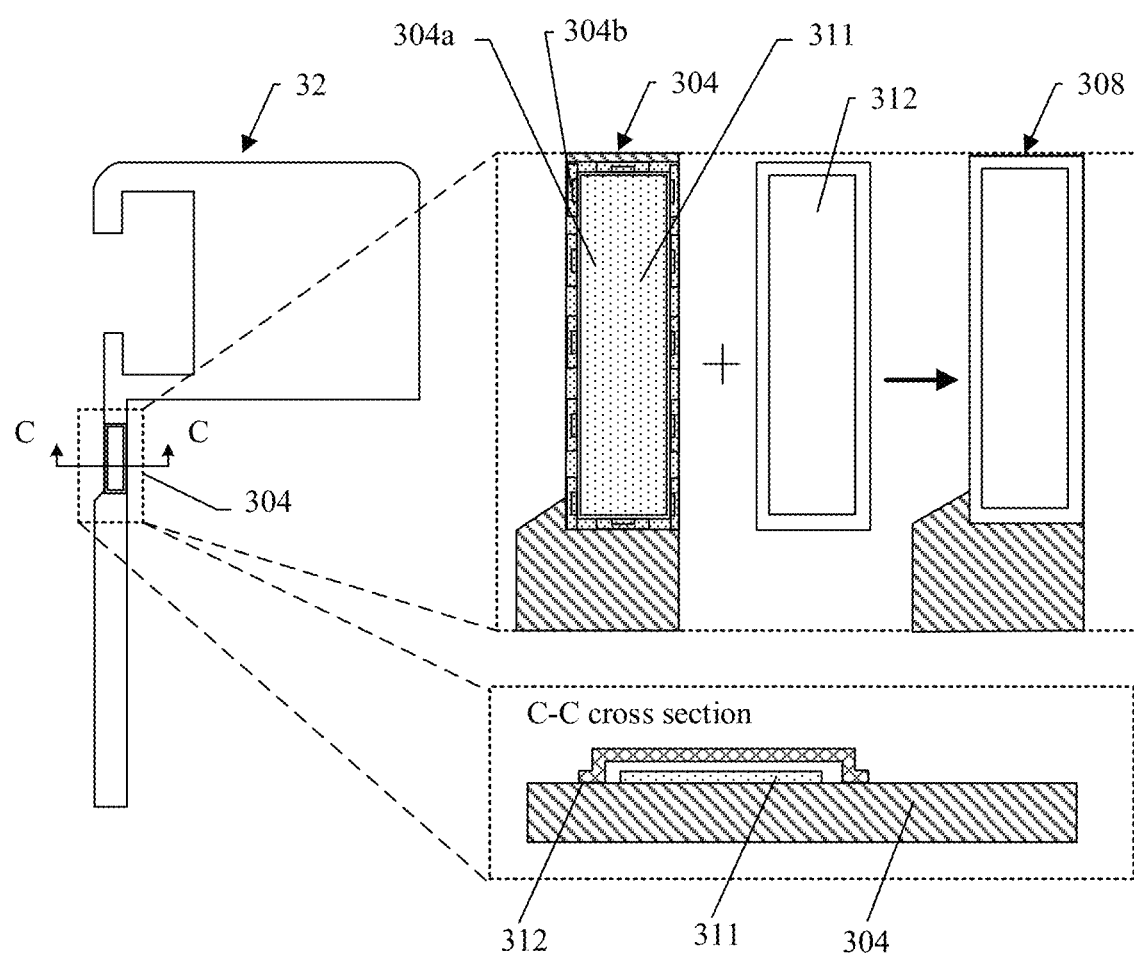
FIG. 7 is a schematic diagram of a structure of another reinforcement structure according to an embodiment of this application.

FIG. 7 is a schematic diagram of a structure of another reinforcement structure according to an embodiment of this application.

Different from the structure shown in FIG. 6, the reinforcement structure in FIG. 7 does not need to additionally solder a high conductivity sheet-like structure, but directly prints solder (for example, alloy solder) or dispenses a conductive adhesive on the reinforcement region 304 of the printed circuit board 32, and the solder or conductive adhesive is then cured by heating or optical curing. The cured solder or conductive adhesive is directly used as a conductive sheet. In other words, the conductive sheet shown in FIG. 6 is a preformed sheet-like structure, and the conductive sheet shown in FIG. 7 may be a sheet-like structure formed by curing solder or a conductive adhesive.

It should be understood that, in this embodiment of this application, the preformed sheet-like structure may be formed separately from the printed circuit board, instead of being formed directly on the printed circuit board. When the conductive sheet is a sheet-like structure formed by curing solder or a conductive adhesive, the conductive sheet may be a sheet-like structure formed after the solder printed on the printed circuit board is cured, or may be a sheet-like structure formed after the conductive adhesive dispensed on the printed circuit board is cured.

Specifically, with reference to an enlarged schematic diagram shown in FIG. 7, a reinforcement region 304 includes a first connection region 304a and a second connection region 304b, and the second connection region 304b is disposed around the first connection region 304a. A conductive sheet 311 is disposed on the first connection region 304a, and the conductive sheet 311 is a cured alloy or conductive adhesive. The conductive sheet 311 is electrically connected to a functional network on the printed circuit board 32.

The second connection region 304b is configured to connect the cover-shaped structure 312. A structure obtained after the cover-shaped structure 312 is disposed on the reinforcement region 304 is shown in a reinforcement region 308 in the figure. The cover-shaped structure 312 may use the structure, material, and connection manner described in FIG. 6. For details, refer to the foregoing description, and details are not described herein again.

In this embodiment of this application, the conductive sheet 311 provides a path for the current in the functional network, which increases a cross-sectional area through which the current flows, and can reduce impedance of the reinforcement region 304. Impedance of the reinforcement region 304 is reduced, and heat generated by the printed circuit board 32 is reduced, so that a temperature of the circuit board is reduced, thereby reducing a temperature of another component used for conducting heat of the circuit board, for example, a housing of the electronic device, and improving heat dissipation of the electronic device and a current utilization.

In addition, the conductive sheet 311 and the cover-shaped structure 312 can enhance mechanical reliability of the circuit board and reduce a risk of board breakage.

Optionally, when the conductive sheet 311 is cured solder (for example, alloy solder), the conductive sheet 311 may be implemented by using a process such as printing, dispensing, or spraying.

Optionally, the alloy solder may be solder paste.

When the conductive sheet 311 is prepared by using solder, the conductive sheet 311 is actually equivalent to a pad. Therefore, the conductive sheet 311 may be prepared simultaneously in a process of preparing a pad on the printed circuit board. Because the pad is directly used as the conductive sheet, there is no need to additionally solder the sheet-like structural part, so that a process may be simplified, costs of an additional sheet-like structure can be reduced, and the conductive sheet can be disposed by using the existing process.

Optionally, when the conductive sheet 311 is a cured conductive adhesive, the conductive adhesive may be first dispensed on the printed circuit board, and a solid-state conductive sheet 311 is obtained through heating or optical curing. The conductive adhesive is directly used as the conductive sheet, and there is no need to additionally connect the sheet-like structural part, so that a process can be simplified and costs can be reduced.

In this embodiment of this application, a gap may be disposed between the cover-shaped structure 312 and the conductive sheet 311, or no gap may be disposed, which needs to be specifically determined based on a material of the cover-shaped structure 312. For a specific case, refer to related description in FIG. 6. For brevity, details are not described herein again. For example, FIG. 7 is a schematic cross-sectional view of a reinforcement region cut along a line C-C, where the cover-shaped structure 312 is separated from the conductive sheet 311.

It should be understood that a thickness (that is, a thickness of the solder or the conductive adhesive) of the conductive sheet 311 may be determined according to actual needs such as internal space of the electronic device, a tolerable risk of board breakage, and an electrical performance indicator (for example, an impedance indicator, a housing temperature, or current utilization efficiency) to be satisfied. This is not specifically limited in this embodiment of this application.

A thickness of the conductive sheet 311 (that is, a thickness of the solder or the conductive adhesive) may be even or uneven. This is not limited in this embodiment of this application.

When the solder or the conductive adhesive is used as the conductive sheet, a thickness of the conductive sheet may be very small, for example, less than 0.2 mm. In this way, an overall height of the reinforcement structure is reduced, which may occupy less internal space.

Figure 8:
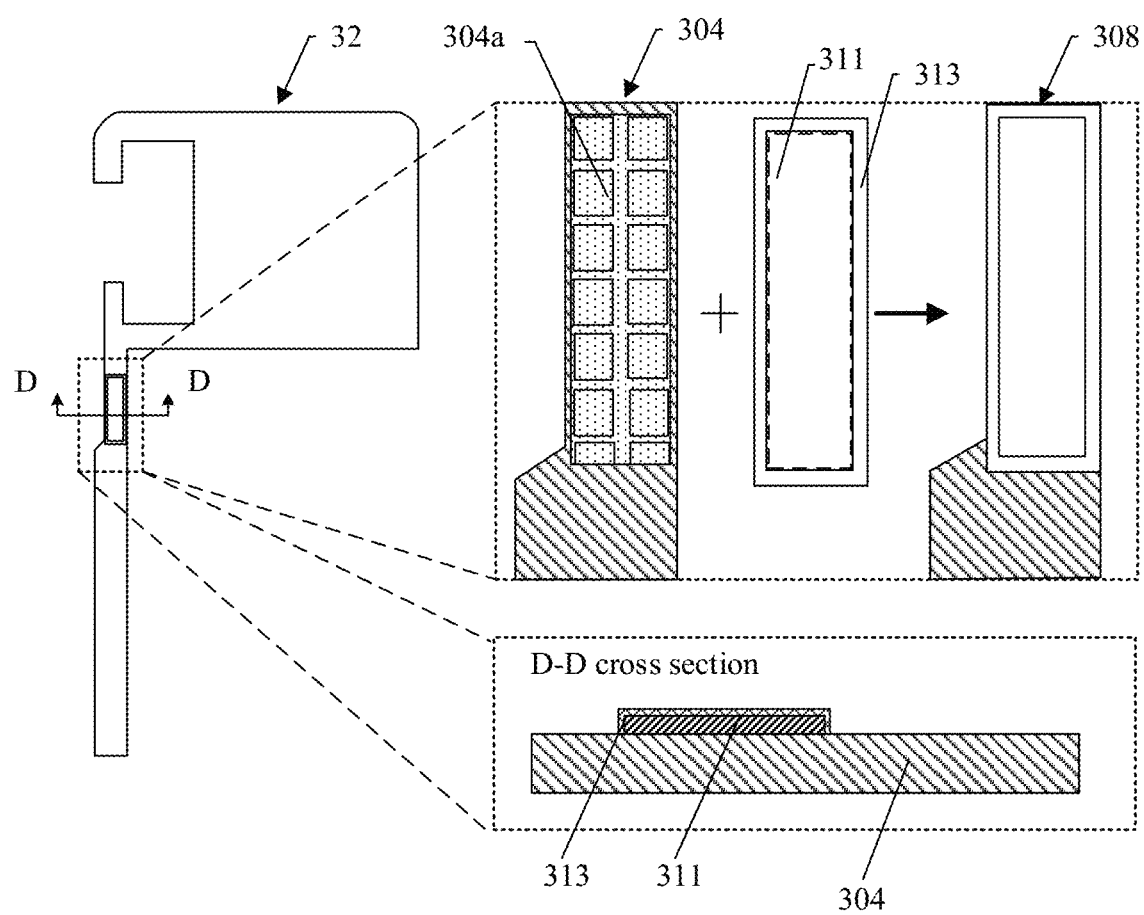
FIG. 8 is a schematic diagram of a structure of still another reinforcement structure according to an embodiment of this application.

FIG. 8 is a schematic diagram of a structure of still another reinforcement structure according to an embodiment of this application.

Different from the structure shown in FIG. 6, the reinforcement structure in FIG. 8 does not need to be additionally connected to a cover-shaped structure. Instead, an insulation layer is directly sprayed on a conductive sheet, and the insulation layer is used as an anti-short circuit structure to separate the conductive sheet from a surrounding metal structural part.

Specifically, with reference to an enlarged schematic diagram shown in FIG. 8, a reinforcement region 304 includes a first connection 304a, and the first connection 304a is configured to connect a conductive sheet 311. The conductive sheet 311 is connected in parallel to a functional network on a printed circuit board 32. The conductive sheet 311 may use the structure, material, and connection manner described in FIG. 6. For details, refer to the foregoing description, and details are not described herein again. A structure obtained after the conductive sheet 311 is disposed on the reinforcement region 304 is shown in a reinforcement region 308 in FIG. 8.

With reference to a schematic cross-sectional view of a reinforcement region cut along a line D-D in FIG. 8, the conductive sheet 311 is coated with an insulation layer 313, and the insulation layer 313 covers all exposed surfaces of the conductive sheet 311. All exposed surfaces of the conductive sheet 311 include a surface (that is, a surface other than a soldering surface, which may also be referred to as a non-connection surface) other than a surface on the conductive sheet 311 that is connected to the printed circuit board 32, that is, include a top and a side wall of the conductive sheet 311.

Optionally, a thickness of the insulation layer 313 may range from 0.01 mm to 0.2 mm, or less than 0.01 mm, or greater than 0.2 mm. It should be understood that a thickness of the insulation layer 313 may be determined according to actual needs such as internal space of the electronic device. This is not specially limited in this embodiment of this application.

The insulation layer 313 may be sprayed on the conductive sheet 311 after the conductive sheet 311 is formed or before delivery, or may be sprayed on the conductive sheet 311 after the conductive sheet 311 is connected to the printed circuit board 32. This is not limited in this embodiment of this application.

In this embodiment of this application, the conductive sheet 311 provides a path for the current in the functional network, which increases a cross-sectional area through which the current flows, and can reduce impedance of the reinforcement region 304. Impedance of the reinforcement region 304 is reduced, heat generated by the printed circuit board is reduced, so that a temperature of the circuit board is reduced, thereby reducing a temperature of another component used for conducting heat of the circuit board, for example, a housing of the electronic device, and improving heat dissipation of the electronic device and a current utilization.

In addition, the conductive sheet 311 can enhance mechanical reliability of the circuit board and reduce a risk of board breakage.

It should be understood that a thickness of the conductive sheet 311 may be determined according to actual needs such as internal space of the electronic device, a tolerable risk of board breakage, and an electrical performance indicator (for example, an impedance indicator, a housing temperature, or current utilization efficiency) to be satisfied. This is not specifically limited in this embodiment of this application.

A thickness of the conductive sheet 311 may be even or uneven. This is not limited in this embodiment of this application.

In some other embodiments, the conductive sheet 311 may alternatively be cured solder or a cured conductive adhesive, or the like. That is, based on the structure shown in FIG. 7, the cover-shaped structure 312 is omitted, and the insulation layer is directly sprayed on the conductive sheet 311. The insulation layer may have a same function as the cover-shaped structure 312.

In some embodiments, the conductive sheet 311 in FIG. 8 may alternatively be replaced with a conductive part of another shape, for example, a cover-shaped structure. The insulation layer is coated on exposed surfaces of these conductive parts, so as to achieve a same effect as the conductive sheet 311.

In this embodiment of this application, a dedicated cover-shaped anti-short circuit structure separated from the conductive sheet 311 does not need to be disposed on the reinforcement region, and instead, the insulation layer 313 is coated on the conductive sheet 311, thereby reducing a thickness of the circuit board, reducing costs of a dedicated cover-shaped anti-short circuit design separated from the conductive sheet, and avoiding a soldering short-circuit problem between the conductive sheet and the anti-short circuit structure.

Figure 9:
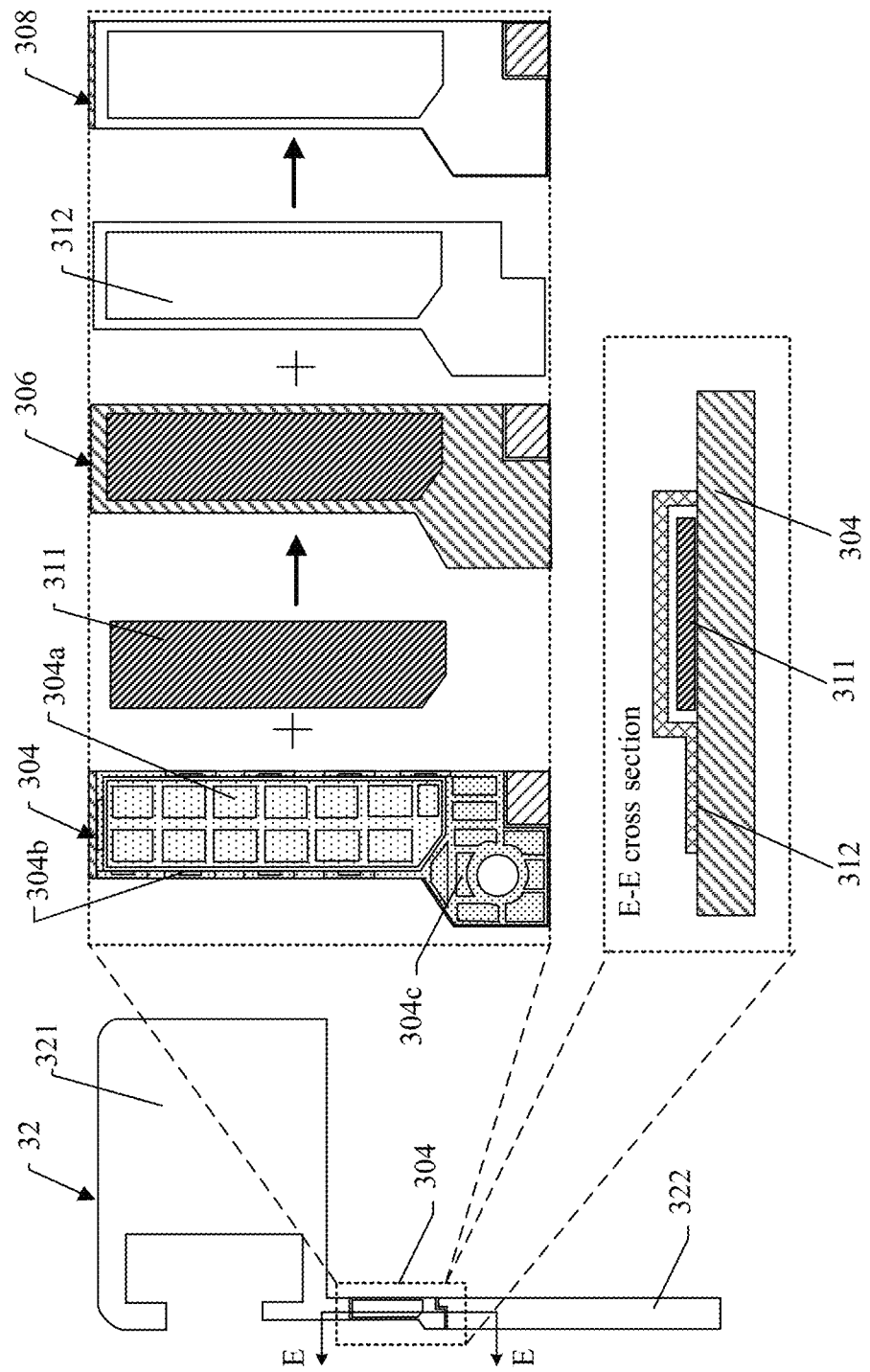
FIG. 9 is a schematic diagram of a structure of yet another reinforcement structure according to an embodiment of this application.

FIG. 9 is a schematic diagram of a structure of yet another reinforcement structure according to an embodiment of this application.

Different from the structure shown in FIG. 6, the reinforcement structure in FIG. 9 is optimized based on an actual shape of the circuit board.

Specifically, with reference to an enlarged schematic diagram shown in FIG. 9, a reinforcement region 304 includes a first connection region 304a, a second connection region 304b, and an extension region 304c. The second connection region 304b is disposed around the first connection region 304a, and the extension region 304c is connected to the second connection region 304b and extends outward from the second connection region 304b. The first connection region 304a is configured to connect a conductive sheet 311, and the second connection region 304b and the extension region 304c are configured to connect a cover-shaped structure 312. It should be understood that a position of the extension region 304c may be determined based on a specific shape of a printed circuit board 32. This is not limited in this embodiment of this application.

The first connection region 304a is connected to a functional network on the printed circuit board 32, the conductive sheet 311 is electrically connected to the first connection region 304a, and the conductive sheet 311 is electrically connected in parallel to the functional network of the circuit board. A structure obtained after the conductive sheet 311 is disposed on the reinforcement region 304 is shown in a reinforcement region 306 in FIG. 9.

The second connection region 304b and the extension region 304c are configured to connect the cover-shaped structure 312. A structure obtained after the cover-shaped structure 312 is disposed on the reinforcement region 306 is shown in a reinforcement region 308 in FIG. 9. With reference to a schematic cross-sectional view of a reinforcement region cut along a line E-E in FIG. 9, the cover-shaped structure 312 forms an accommodation space for accommodating the conductive sheet 311, and the cover-shaped structure 312 includes an extension surface connected to the extension region 304c. The cover-shaped structure 312 may use the material and connection manner described in FIG. 6. For details, refer to the foregoing description, and details are not described herein again.

In this embodiment of this application, the conductive sheet 311 provides a path for the current in the functional network, which increases a cross-sectional area through which the current flows, and can reduce impedance of the reinforcement region 304. Impedance of the reinforcement region 304 is reduced, heat generated by the printed circuit board is reduced, so that a temperature of the circuit board is reduced, thereby reducing a temperature of another component used for conducting heat of the circuit board, for example, a housing of the electronic device, and improving heat dissipation of the electronic device and user experience.

In addition, the conductive sheet 311 and the cover-shaped structure 312 can enhance mechanical reliability of the circuit board and reduce a risk of board breakage. In this embodiment of this application, a structure of the cover-shaped structure 312 is optimized. A design of the extension surface can increase a contact area between the cover-shaped structure 312 and the printed circuit board 32, thereby further enhancing mechanical strength of the circuit board and improving mechanical reliability of the circuit board.

In some embodiments, as shown in FIG. 9, the printed circuit board 32 includes a first circuit board part 321 and a second circuit board part 322, and the first circuit board part 321 and the second circuit board part 322 are separable. If the reinforcement region is located on the first circuit board part 321, the reinforcement structure is disposed on the first circuit board part 321. As shown in the figure, the extension region 304c of the reinforcement region 304 and the second circuit board part 322 are disposed in a staggered manner, and correspondingly, the extension surface of the cover-shaped structure 312 and the second circuit board part 322 are disposed in a staggered manner.

In this embodiment of this application, the cover-shaped structure 312 in the reinforcement structure and the second circuit board part 322 are disposed in a staggered manner, so that mechanical reliability of the circuit board may be further improved.

It should be understood that a person skilled in the art may further perform structural optimization in another form depending on a shape of the circuit board. This is not limited in this embodiment of this application.

It should be further understood that the conductive sheet is merely used as an example for description in this embodiment of this application. In some other embodiments, the conductive sheet 311 may be replaced with a conductive part of another shape or structure, and can also achieve a same effect as that of the conductive sheet. This is not limited in this embodiment of this application. In other words, the reinforcement structure includes a conductive part and a cover-shaped structure. The conductive part is electrically connected in parallel to a functional network on the printed circuit board, and the cover-shaped structure covers the conductive part and is connected to the printed circuit board. Alternatively, the reinforcement structure includes a conductive part. The conductive part is electrically connected in parallel to a functional network on the printed circuit board, and an exposed surface of the conductive part is coated with an insulation layer. A specific example of the conductive part may be the conductive sheet 311 described above.

An embodiment of this application further provides a circuit board. The reinforcement structure provided in embodiments of this application is disposed on the circuit board. A conductive part in the reinforcement structure may be electrically connected in parallel to a functional network on the circuit board by using a high conductivity sheet-like structure, a cover-shaped structure, solder (for example, alloy solder), a conductive adhesive layer, or the like. The conductive part may provide a path for a current, which increases a cross-sectional area through which the current flows, and can reduce impedance, and improve heat dissipation and current utilization efficiency.

In addition, if an insulation cover-shaped structure, an insulation coating, or a cover-shaped structure connected to a ground network of the circuit board is added to a non-soldering surface of a conductive part such as a high conductivity sheet-like structure, solder, or a conductive adhesive layer, a short circuit between the conductive part such as the high conductivity sheet-like structure, the solder, or the conductive adhesive layer, and a surrounding metal component such as a middle frame or a grounded structural part, for example, a circuit board bracket, may be avoided.

The reinforcement structure disposed on the circuit board may further enhance mechanical reliability of the circuit board, and reduce a risk of board breakage.

It should be understood that the reinforcement structure provided in this embodiment of this application may be disposed at any position on the circuit board. For example, the reinforcement structure may be disposed at a position where there is an impedance bottleneck on the circuit board, may be disposed at a position where a current path is relatively long on the circuit board, may be disposed at a position where a width is relatively narrow on the circuit board, or may be disposed at a severely heated position on the circuit board.

It should be further understood that a functional network connected to the conductive sheet in this embodiment of this application includes but is not limited to a charging network (for example, a voltage bus (voltage bus, VBUS) circuit), a network that supplies power to a display, a network that supplies power to an audio module, and another scenario in which impedance is reduced, and heat dissipation, efficiency, and mechanical reliability of the circuit board are improved.

Figure 10:
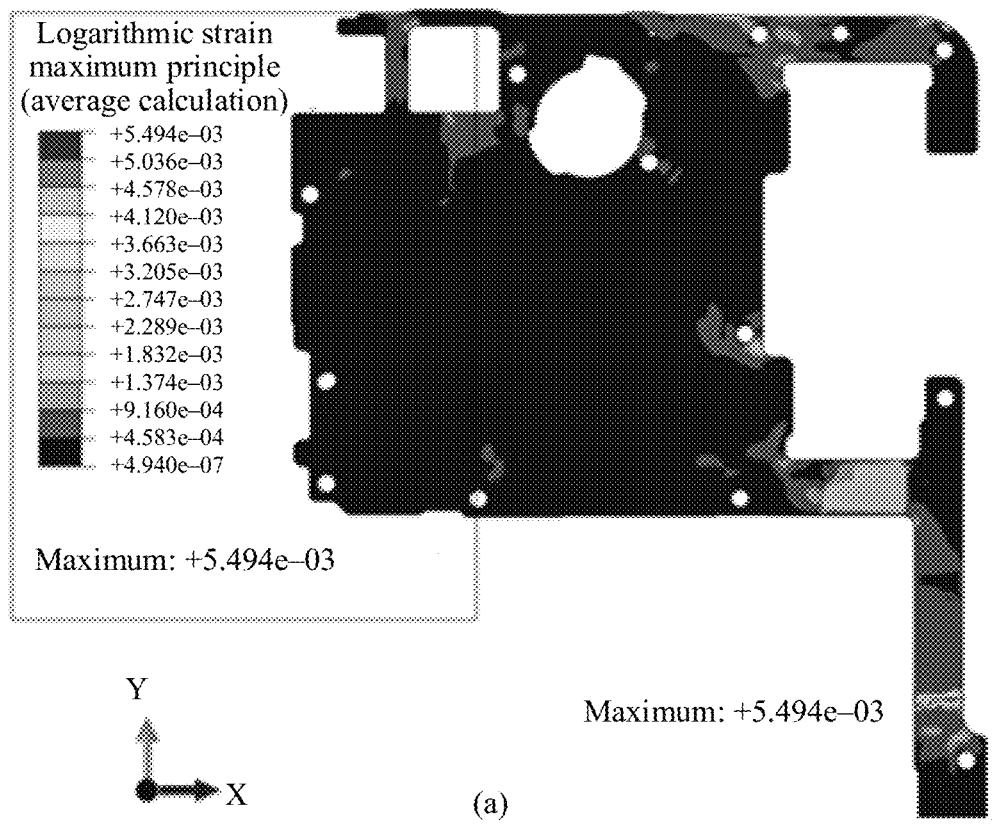
FIG. 10 is a schematic diagram of strain simulation of a reinforcement structure and an existing reinforcement structure according to an embodiment of this application.
Figure 10:
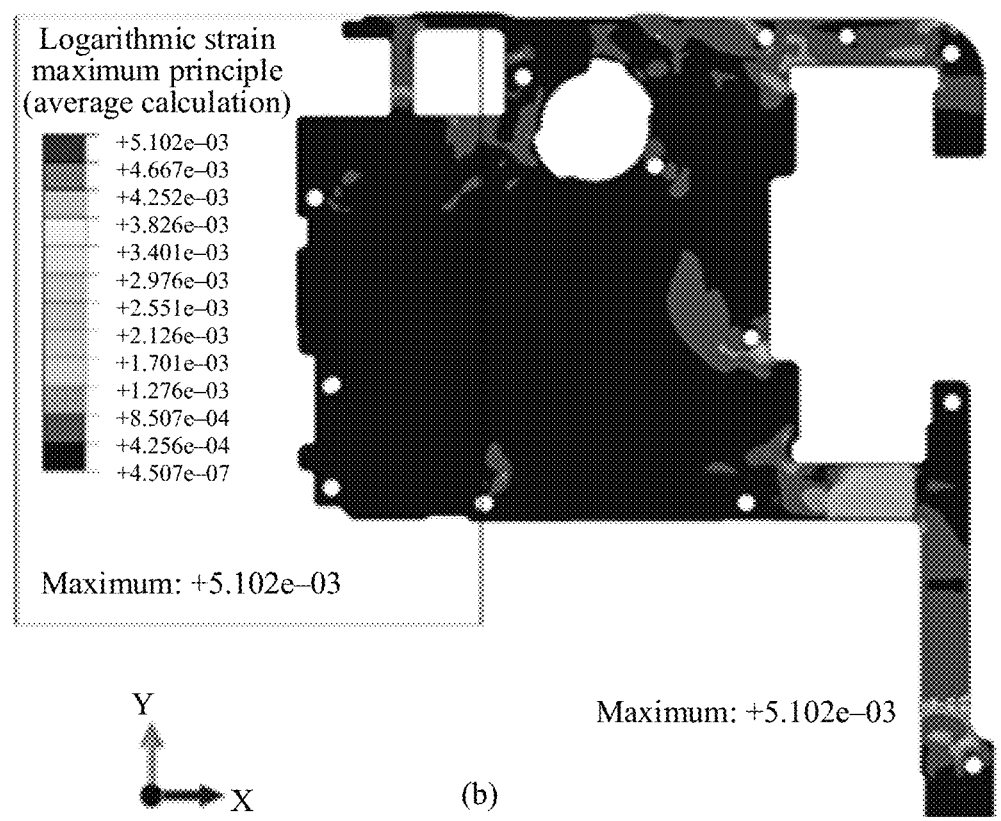

FIG. 10 is a schematic diagram of strain simulation of a reinforcement structure and an existing reinforcement structure according to an embodiment of this application.

Herein, FIG. 10 shows strain simulation performed by applying a reinforcement structure to a narrow strip region of an L-shaped circuit board. (a) in FIG. 10 is a schematic diagram of strain simulation when a stainless steel sheet is used for reinforcement in the conventional technology. (b) in FIG. 10 is a schematic diagram of strain simulation when the reinforcement structure (the conductive sheet and cover-shaped structure) shown in FIG. 9 is used for reinforcement.

For example, a reinforcement structure used in (a) in FIG. 10 is a stainless steel sheet with a thickness of 0.3 mm, a conductive sheet used in (b) in FIG. 10 is a copper-nickel-zinc alloy sheet with a thickness of 0.2 mm, and a cover-shaped structure is stainless steel with a thickness of 0.2 mm. It may be seen from FIG. 10 that, when the stainless steel sheet is used for reinforcement, a strain of a board assembly is 5,494 microstrains (unit of microstrains: ue). However, when the copper-nickel-zinc alloy sheet and the stainless steel cover-shaped structure provided in this embodiment of this application are used for reinforcement, a strain of the board assembly is 5,102 ue.

Therefore, the reinforcement structure provided in this embodiment of this application can improve an anti-deformation capability of the circuit board, and a risk of board breakage is acceptable and is lower than that of a conventional reinforcement steel sheet.

Table 1 shows an improvement effect of the reinforcement structure simulated in (b) in FIG. 10 on electrical performance.

In this embodiment of this application, for example, the reinforcement structure is applied to a charging network (for example, a VBUS circuit), and electrical performance of the circuit board is tested and compared in the absence and presence of a conductive sheet (for example, a copper-nickel-zinc alloy sheet).

TABLE 1

Test data comparison

| Parameter | Measured impedance (mΩ) | Highest housing temperature in an extreme charging mode (° C.) | Charging efficiency in an extreme charging mode |
|---|---|---|---|
| Without a copper-nickel-zinc alloy sheet | 14.3 | 37.3 | 84.8% |
| With a copper-nickel-zinc alloy sheet | 13.7 | 36.8 | 86.3% |
| Degree of improvement | 0.6 | 0.5 | 1.5% |

It may be seen from Table 1 that, when no copper-nickel-zinc alloy sheet is disposed, a measured impedance of the circuit board is 14.3 milliohms (mΩ), a highest housing temperature in an extreme charging mode is 37.3° C., and a charging efficiency in an extreme charging mode is 84.8%. When a copper-nickel-zinc alloy sheet is disposed (that is, the copper-nickel-zinc alloy sheet is electrically connected to the charging circuit of the circuit board), a measured impedance of the circuit board is 13.7 mΩ, a highest housing temperature in an extreme charging mode is 36.8° C., and a charging efficiency in an extreme charging mode is 86.3%. Correspondingly, the copper-nickel-zinc alloy sheet is disposed to reduce impedance by 0.6 mΩ, reduce the highest housing temperature in an extreme charging mode by 0.5° C., and improve the charging efficiency in an extreme charging mode by 1.5%.

Therefore, the reinforcement structure provided in this embodiment of this application can reduce impedance, and improve heat dissipation, charging efficiency, and board reliability.

It should be understood that the extreme charging mode in this embodiment of this application may be understood as a mode in which a high current and a high voltage are required for charging, for example, a fast charging mode.

It should be further understood that, for different application scenarios, a person skilled in the art may optimize and design the reinforcement structure provided in this embodiment of this application in terms of a material, structure, and thickness, to meet an electrical performance indicator and mechanical strength.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A printed circuit board assembly, comprising:
a printed circuit board, wherein the printed circuit board comprises a functional network, and the functional network is configured to provide an electrical function;
a conductive part, wherein the conductive part is connected to the printed circuit board and is separately electrically connected to the functional network, and wherein the conductive part is a conductive sheet; and
a cover-shaped structure, wherein the cover-shaped structure covers the conductive part and is connected to the printed circuit board, a gap is disposed between the cover-shaped structure and the conductive part, the cover-shaped structure is made of metal, configured to reduce a risk of breakage to the printed circuit board, and the cover-shaped structure is configured to prevent the conductive part located in the cover-shaped structure from contacting a conductor outside the cover-shaped structure,
wherein the printed circuit board comprises a transverse wide region and a narrow strip region that extends longitudinally, a width of the narrow strip region is less than that of the wide region, and the conductive part and the cover-shaped structure are disposed on the narrow strip region.

2. The printed circuit board assembly according to claim 1, wherein the printed circuit board further comprises a ground network, wherein
the cover-shaped structure is electrically connected to the ground network.

3. The printed circuit board assembly according to claim 1, wherein the cover-shaped structure is made of an insulation material.

4. The printed circuit board assembly according to claim 1, wherein the conductive sheet is formed from cured solder, or formed from a cured conductive adhesive.

5. The printed circuit board assembly according to claim 1, wherein the conductive part is fixedly connected to the printed circuit board.

6. The printed circuit board assembly according to claim 1, wherein the cover-shaped structure is fixedly connected to the printed circuit board.

7. The printed circuit board assembly according to claim 1, wherein the printed circuit board comprises a first circuit board part and a second circuit board part that are separable, wherein
the first circuit board part comprises a first connection region, a second connection region disposed around the first connection region, and an extension region extending outwards from the second connection region;
the first connection region is connected to the conductive part;
the second connection region and the extension region are connected to the cover-shaped structure; and
the extension region and the second circuit board part are disposed in an overlapping manner.

8. The printed circuit board assembly according to claim 1, wherein the functional network comprises a charging circuit and/or a power supply circuit.

9. An electronic device, comprising:
a printed circuit board assembly, wherein the printed circuit board assembly comprises;
a printed circuit board, wherein the printed circuit board comprises a functional network, and the functional network is configured to provide an electrical function;
a conductive part, wherein the conductive part is connected to the printed circuit board and is separately electrically connected to the functional network, and wherein the conductive part is a conductive sheet; and
a cover-shaped structure, wherein the cover-shaped structure covers the conductive part and is connected to the printed circuit board, a gap is disposed between the cover-shaped structure and the conductive part, the cover-shaped structure is made of metal, configured to reduce a risk of breakage to the printed circuit board, and the cover-shaped structure is configured to prevent the conductive part located in the cover-shaped structure from contacting a conductor outside the cover-shaped structure,
wherein the printed circuit board comprises a transverse wide region and a narrow strip region that extends longitudinally, a width of the narrow strip region is less than that of the wide region, and the conductive part and the cover-shaped structure are disposed on the narrow strip region.

10. The electronic device according to claim 9, wherein the printed circuit board further comprises a ground network, wherein
the cover-shaped structure is electrically connected to the ground network.

11. The electronic device according to claim 9, wherein the cover-shaped structure is made of an insulation material.

12. The electronic device according to claim 9, wherein the conductive sheet is formed from cured solder, or formed from a cured conductive adhesive.

13. The electronic device according to claim 9, wherein the conductive part is fixedly connected to the printed circuit board.

14. The printed circuit board assembly according to claim 9, wherein the cover-shaped structure is fixedly connected to the printed circuit board.

15. The printed circuit board assembly according to claim 9, wherein the printed circuit board comprises a first circuit board part and a second circuit board part that are separable, wherein
the first circuit board part comprises a first connection region, a second connection region disposed around the first connection region, and an extension region extending outwards from the second connection region;
the first connection region is connected to the conductive part;
the second connection region and the extension region are connected to the cover-shaped structure; and
the extension region and the second circuit board part are disposed in an overlapping manner.

16. The printed circuit board assembly according to claim 9, wherein the functional network comprises a charging circuit and/or a power supply circuit.

* * * * *